United States Patent
Xi

(10) Patent No.: US 9,214,479 B2
(45) Date of Patent: Dec. 15, 2015

(54) LIGHT EMITTING DIODE DISPLAY PANEL

(71) Applicant: AU Optronics Corp., Hsin-Chu (TW)

(72) Inventor: Peng-Bo Xi, Hsin-Chu (TW)

(73) Assignee: AU Optronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/284,402

(22) Filed: May 22, 2014

(65) Prior Publication Data

US 2014/0346537 A1 Nov. 27, 2014

(30) Foreign Application Priority Data

May 23, 2013 (TW) .............................. 102118289 A

(51) Int. Cl.
*H01L 27/32* (2006.01)
*H01L 27/12* (2006.01)

(52) U.S. Cl.
CPC ...... *H01L 27/124* (2013.01); *G09G 2300/0426* (2013.01); *H01L 27/3279* (2013.01)

(58) Field of Classification Search
CPC combination set(s) only.
See application file for complete search history.

(56) References Cited

U.S. PATENT DOCUMENTS

| 2005/0030268 A1 | 2/2005 | Zhang | |
|---|---|---|---|
| 2005/0162353 A1* | 7/2005 | Kanda | 345/76 |
| 2005/0258771 A1* | 11/2005 | Kang et al. | 315/169.1 |
| 2011/0050550 A1* | 3/2011 | Tsai et al. | 345/76 |
| 2011/0291115 A1 | 12/2011 | Kim | |
| 2012/0293496 A1* | 11/2012 | Park et al. | 345/419 |

\* cited by examiner

*Primary Examiner* — John C Ingham
(74) *Attorney, Agent, or Firm* — Winston Hsu; Scott Margo

(57) ABSTRACT

A light emitting diode (LED) display panel includes a plurality of pixel units, a plurality of first bar-shaped electrode layers arranged along a first direction and a plurality second bar-shaped electrode layers arranged along a second direction. The first bar-shaped electrode layers are coupled to a first power supply and the pixel units, and the second bar-shaped electrode layers are also coupled to the first power supply. Only a non-complete portion of overlap positions between the first and second bar-shaped electrode layers have first conductive paths configured to couple the first bar-shaped electrode layers to the corresponding second bar-shaped electrode layers.

15 Claims, 11 Drawing Sheets

LIGHT EMITTING DIODE DISPLAY PANEL

BACKGROUND OF THE INVENTION

1. Field of the Invention

This invention is related to a light emitting diode display panel, and particularly, a structure of a light emitting diode display panel for power transmission.

2. Description of the Prior Art

Due to their slim shapes, low power consumption and low radiation, liquid crystal displays (LCDs) are widely applied in electronic devices such as notebooks, monitors, and PDAs (personal digital assistants). In the prior art display panel, a current flowing through traces will cause a voltage drop, reducing the voltage received by pixels and the current flowing to the pixels. This will cause uneven brightness throughout the display panel. In a large display panel such as a display panel over 32 inches, the multitude of traces and electronic components will increase internal impedance, causing a big voltage drop and deteriorating display quality.

SUMMARY OF THE INVENTION

An embodiment of the present invention discloses a light emitting diode display panel comprising a plurality of pixel units, a plurality of first bar-shaped electrode layers arranged along a first direction, and a plurality of second bar-shaped electrode layers arranged along a second direction. The first bar-shaped electrode layers are electrically coupled to a first power supply and the pixel units, and the second bar-shaped electrode layers are electrically coupled to the first power supply. Only a non-complete portion of a plurality of overlap positions between the first bar-shaped electrode layers and the second bar-shaped electrode layers have first conductive paths electrically coupled to corresponding first bar-shaped electrode layers and second bar-shaped electrode layers.

Another embodiment of the present invention discloses another light emitting diode display panel comprising a plurality of pixel units, a plurality of first bar-shaped electrode layers, a plurality of second bar-shaped electrode layers, a plurality of first intercepting points, and a plurality of first conductive paths. The plurality of first bar-shaped electrode layers are arranged along a first direction and electrically coupled to a first power supply and the pixel units. The plurality of second bar-shaped electrode layers are arranged along a second direction and electrically coupled to the first power supply. The plurality of first intercepting points are correspond to overlappings between said first bar-shaped electrode layers and said second bar-shaped electrode layers. The plurality of first conductive paths are positioned at said intercepting points in an alternated fashion or in a interleaving arrangement.

These and other objectives of the present invention will no doubt become obvious to those of ordinary skill in the art after reading the following detailed description of the preferred embodiment that is illustrated in the various figures and drawings.

DETAILED DESCRIPTION

The detailed descriptions of the present invention are exemplified below in examples. However, the examples are merely used to illustrate the present invention, not to limit the present invention. Because one skilled in the art may modify the present invention or combine the present invention with some features within the scope of the present invention, the claimed scope of the present invention should be referred to in the following claims.

The terms "substantially," "around," "about" and "approximately" can refer to within 20% of a given value or range, and preferably within 10%. Besides, the term "electrically coupled" can be referring to either directly connecting or indirectly connecting between elements. Thus, if it is described in the below contents of the present invention that a first device is electrically coupled to a second device, the first device can be directly connected to the second device, or indirectly connected to the second device through other devices or means. In the entire specification and claims, unless the contents clearly specify the meaning of some terms, if there is a description such as "a result B happens according to a parameter A", the parameter A can be referred as the only one parameter or one of a plurality of parameters which affect (s) the result B. In the entire specification and claims, when an element or a component is described to be "configured/used to execute a function", the function is not the only function of the element or component, in other words, the mentioned function might be just one of a plurality of functions of the element or component.

The embodiments and figures are provided as follows in order to illustrate the present invention in detail, but please notice that the claimed scope of the present invention is not limited by the provided embodiments and figures.

Figure 1A:
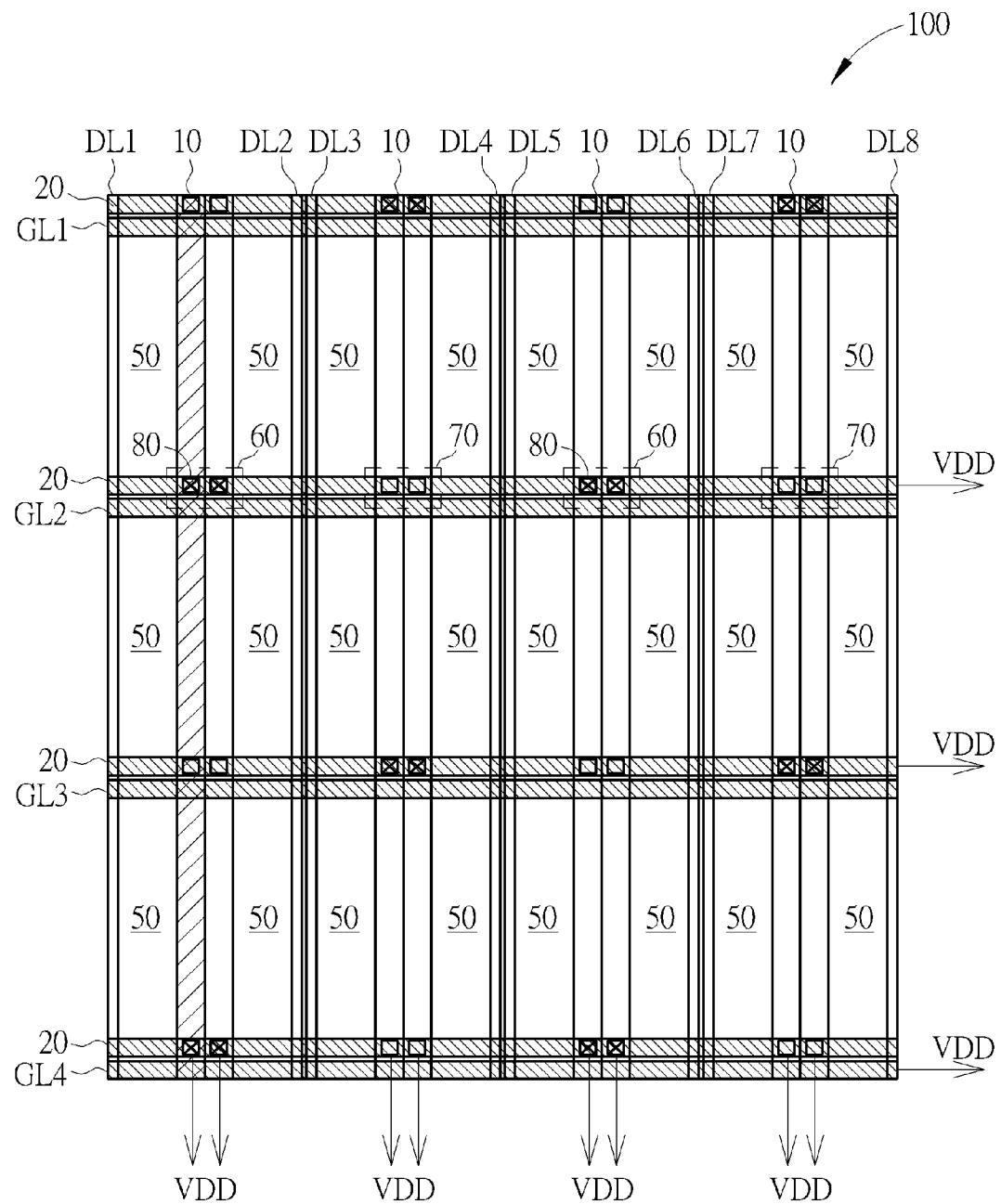
FIG. 1A shows a light emitting diode display panel according to a first embodiment of the present invention.

Please refer to FIG. 1A. FIG. 1A shows a light emitting diode display panel 100 according to a first embodiment of the present invention. As shown in FIG. 1A, the light emitting diode display panel 100 comprises a plurality of pixel units 50, a plurality of first bar-shaped electrode layers 10 arranged along a first direction and a plurality of second bar-shaped electrode layers 20 arranged along a second direction. The first direction and the second direction can be a vertical direction and a horizontal direction respectively. The pixel units 50 can be arranged as an array and coupled to a plurality of data lines DL1~DL8 and a plurality of scan lines GL1~GL4 in the light emitting diode display panel 100. The second bar-shaped electrode layers 20 are electrically coupled to a first power supply VDD and the pixel units 50, and are electrically coupled to corresponding pixel units 50 through corresponding first bar-shaped electrode layers 10. The first bar-shaped electrode layers 10 and the second bar-shaped electrode layers 20 are configured to provide power to the pixel units 50 from the first power supply VDD. The first power supply VDD can be a voltage source with a high reference voltage level.

Only a non-complete portion of a plurality of overlap positions between the first bar-shaped electrode layers 10 and the second bar-shaped electrode layers 20 have conductive paths 80. The conductive paths 80 are configured to electrically couple the first bar-shaped electrode layers 10 to the corresponding second bar-shaped electrode layers 20. For instance, the conductive paths 80 are only formed at overlap positions 60 while no conductive paths are formed at overlap positions 70. Each of the conductive paths 80 can be a via configured to electrically couple a first bar-shaped electrode layer 10 to a corresponding second bar-shaped electrode layer 20. According to the first embodiment of the present invention, each of the first bar-shaped electrode layers 10 can be arranged to cross all of the second bar-shaped electrode layers 20. The overlap positions 60 and the overlap positions 70 are positioned alternatively. Each of the overlap positions 60 has at least one conductive path. Each of the overlap positions 70 does not have any conductive path.

Because only the overlap positions 60 between the first bar-shaped electrode layers 10 and the second bar-shaped electrode layers 20 have conductive paths 80, currents can only flow from the second bar-shaped electrode layers 20 to the first bar-shaped electrode layer 10 through the overlap positions 60, not through the overlap positions 70. Hence, each of the second bar-shaped electrode layers 20 is disposed to provide currents to a non-complete portion of the first bar-shaped electrode layers 10 intersecting the second bar-shaped electrode layer 20. Take the second one of the second bar-shaped electrode layers 20 counted from the top side of the light emitting diode display panel 100 as an example, this second bar-shaped electrode layer 20 is only electrically coupled to the first one and the third one of the first bar-shaped electrode layers 10 counted from the left side of the light emitting diode display panel 100 through the conductive paths 80. Hence, a current from the second one of the second bar-shaped electrode layers 20 can only flow to the first one and the third one of the first bar-shaped electrode layers 10 and then to pixel units 50 electrically coupled to the first one and the third one of the first bar-shaped electrode layers 10.

Compared to an embodiment which conductive paths 80 are formed at all overlap positions between the first bar-shaped electrode layers 10 and the second bar-shaped electrode layers 20, currents flowing through the second bar-shaped electrode layers 20 of the light emitting diode display panel 100 can be smaller. If the impedance of the second bar-shaped electrode layers 20 remains unchanged, reducing the current flowing though the second bar-shaped electrode layers 20 can correspondingly reduce a voltage drop equal to the product of the current and the impedance, making the voltage at the pixel units 50 closer to the voltage level of the first power supply VDD provided to the second bar-shaped electrode layers 20.

The pixel units 50 can include red, green and blue pixel units if the display panel 100 is an RGB display, or include red, green, blue and white pixel units if the display panel 100 is an RGBW display. In FIG. 1A, the numbers of pixel units 50, data lines DL1~DL8, scan lines GL1~GL4, first bar-shaped electrode layers 10 and second bar-shaped electrode layers 20 are merely shown as an example, not to limit the scope of the present invention.

In the structure shown in FIG. 1A, about half of the overlap positions between the first bar-shaped electrode layers 10 and the second bar-shaped electrode layers 20 have conductive paths 80 while another half of the overlap positions do not. The overlap positions 60 (with the conductive paths 80) and the overlap positions 70 (without any conductive path 80) are arranged alternatively. However, the present invention is not limited to the structure of FIG. 1A. Another possible structure is shown in FIG. 1B.

Figure 1B:
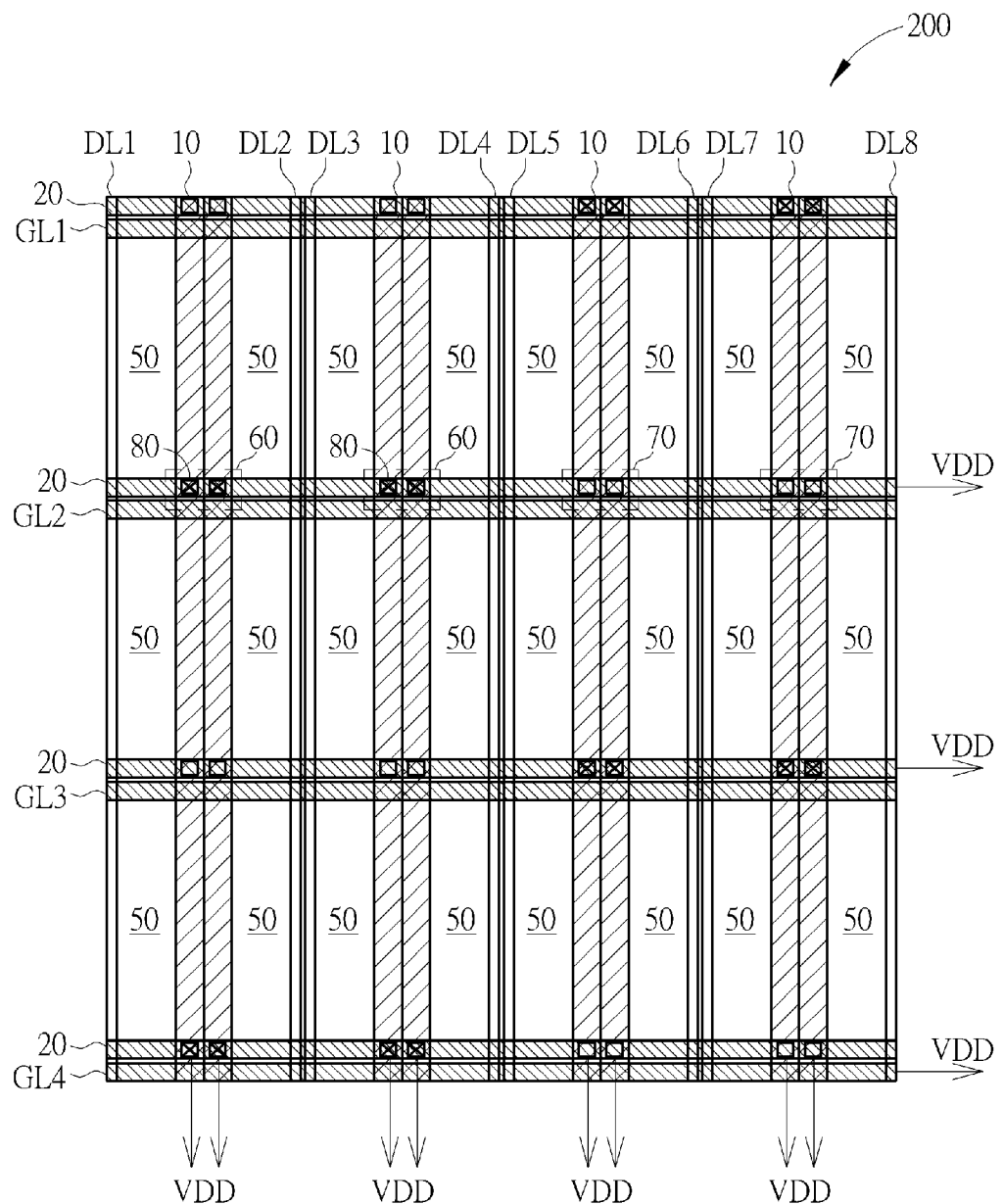
FIG. 1B shows a light emitting diode display panel according to a second embodiment of the present invention.

Please refer to FIG. 1B. FIG. 1B shows a light emitting diode display panel 200 according to a second embodiment of the present invention. The difference between the light emitting diode display panel 200 and the light emitting diode display panel 100 is in the arrangement of the conductive paths 80. In the light emitting diode display panel 200, two consecutive overlap positions 60 with conductive paths 80 alternate with two consecutive overlap positions 70 without conductive path 80 in each of the second bar-shaped electrode layers 20. As shown in FIG. 1A and FIG. 1B, the light emitting diode display panels 100 and 200 are configured in mesh layout. Comparing with the prior art where every overlap position has conductive paths, the current flowing through each power trace in the light emitting diode display panel 100, 200 can be substantially halved, reducing the voltage drop across the power traces.

Figure 2A:
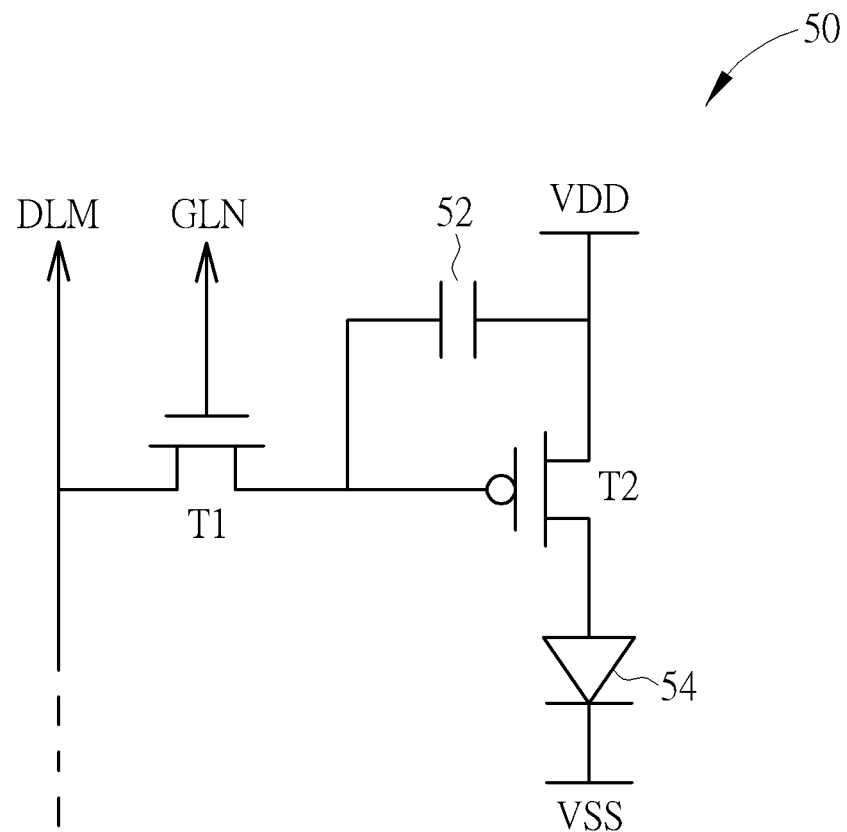
FIG. 2A shows a pixel unit of the light emitting diode display panel in FIG. 1A.

Please refer to FIG. 2A. FIG. 2A is a circuit diagram of a pixel unit 50 in FIG. 1A according to an embodiment of the present invention. As shown in FIG. 2A, the pixel unit 50 includes an N-type thin film transistor (TFT) T1, a P-type TFT T2, a storage capacitor 52 and a light emitting diode (LED) 54. A gate terminal of the N-type TFT T1 is electrically coupled to a corresponding scan line GLN, and a drain terminal of N-type TFT T1 is electrically coupled to a corresponding data line DLM. A gate terminal of the P-type TFT T2 is electrically coupled to a source terminal of the N-type TFT T1. A first terminal of the storage capacitor 52 is electrically coupled to the gate terminal of the P-type TFT T2 and the source terminal of the N-type TFT T1, and a second terminal of the storage capacitor 52 is electrically coupled to a source terminal of the P-type TFT T2 and the first power supply VDD. An anode of the LED 54 is electrically coupled to a drain terminal of the P-type TFT T2, and a cathode of the LED 54 is electrically coupled to the second power supply VSS. The second power supply VSS can be a voltage source with a low reference voltage level while the first power supply VDD can be a voltage source with a high reference voltage level. Moreover, a current flowing through the LED 54 is adjusted by a voltage difference between the gate terminal and the source terminal of the P-type TFT T2, hence a variation of the first power supply VDD will affect the current flowing through the LED 54.

Figure 2B:
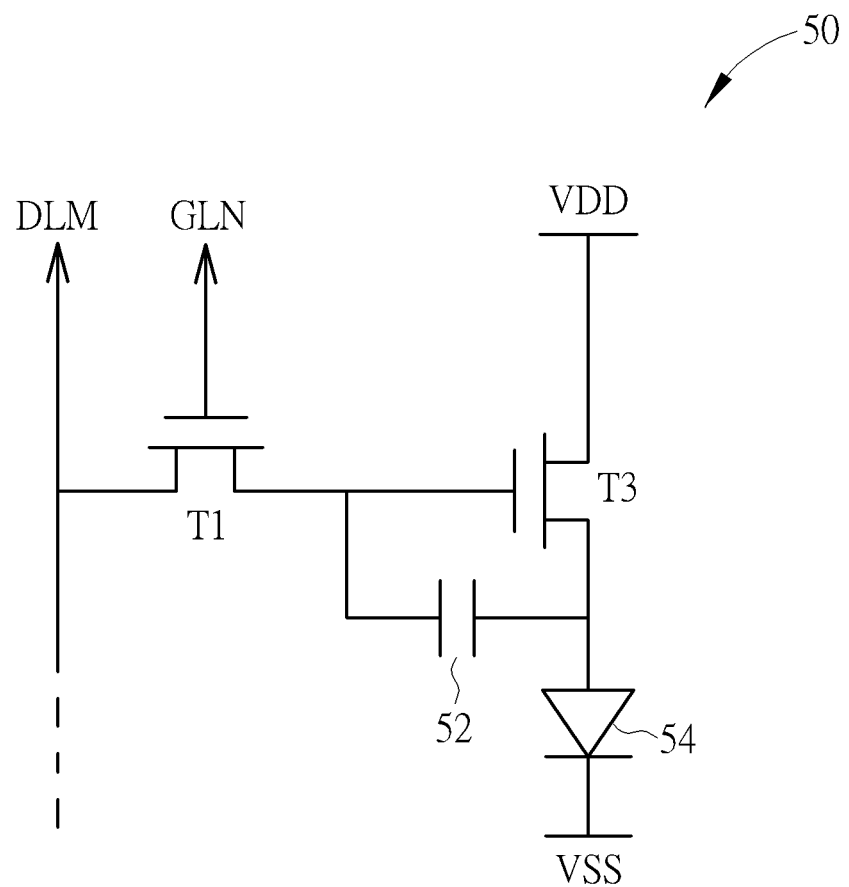
FIG. 2B shows another pixel unit of the light emitting diode display panel in FIG. 1A.

Please refer to FIG. 2B. FIG. 2B is a circuit diagram of a pixel unit 50 in FIG. 1A according to another embodiment of the present invention. As shown in FIG. 2B, the pixel unit 50 includes N-type thin film transistors (TFT) T1 and T3, a storage capacitor 52 and a light emitting diode (LED) 54. A gate terminal of the N-type TFT T1 is electrically coupled to a corresponding scan line GLN, and a drain terminal of the N-type TFT T1 is electrically coupled to a corresponding data line DLM. A gate terminal of the N-type TFT T3 is electrically coupled to a source terminal of the N-type TFT T1, and a drain terminal of the N-type TFT T3 is electrically coupled to the first power supply VDD. A first terminal of the storage capacitor 52 is electrically coupled to the gate terminal of the N-type TFT T3 and the source terminal of the N-type TFT T1, and a second terminal of the storage capacitor 52 is electrically coupled to a source terminal of the N-type TFT T3. An anode of the LED 54 is electrically coupled to the source terminal of the N-type TFT T3, and a cathode of the LED 54 is electrically coupled to the second power supply VSS. The second power supply VSS can be a voltage source with a low reference voltage level while the first power supply VDD can be a voltage source with a high reference voltage level. Moreover, a current flowing through the LED 54 is adjusted by a voltage difference between the gate terminal and the source terminal of the N-type TFT T3, hence a variation of the second power supply VSS will influence the current flowing through the LED 54. The pixel units 50 shown in FIG. 2A and FIG. 2B are merely shown as examples but not to limit the scope of the present invention.

Figure 3A:
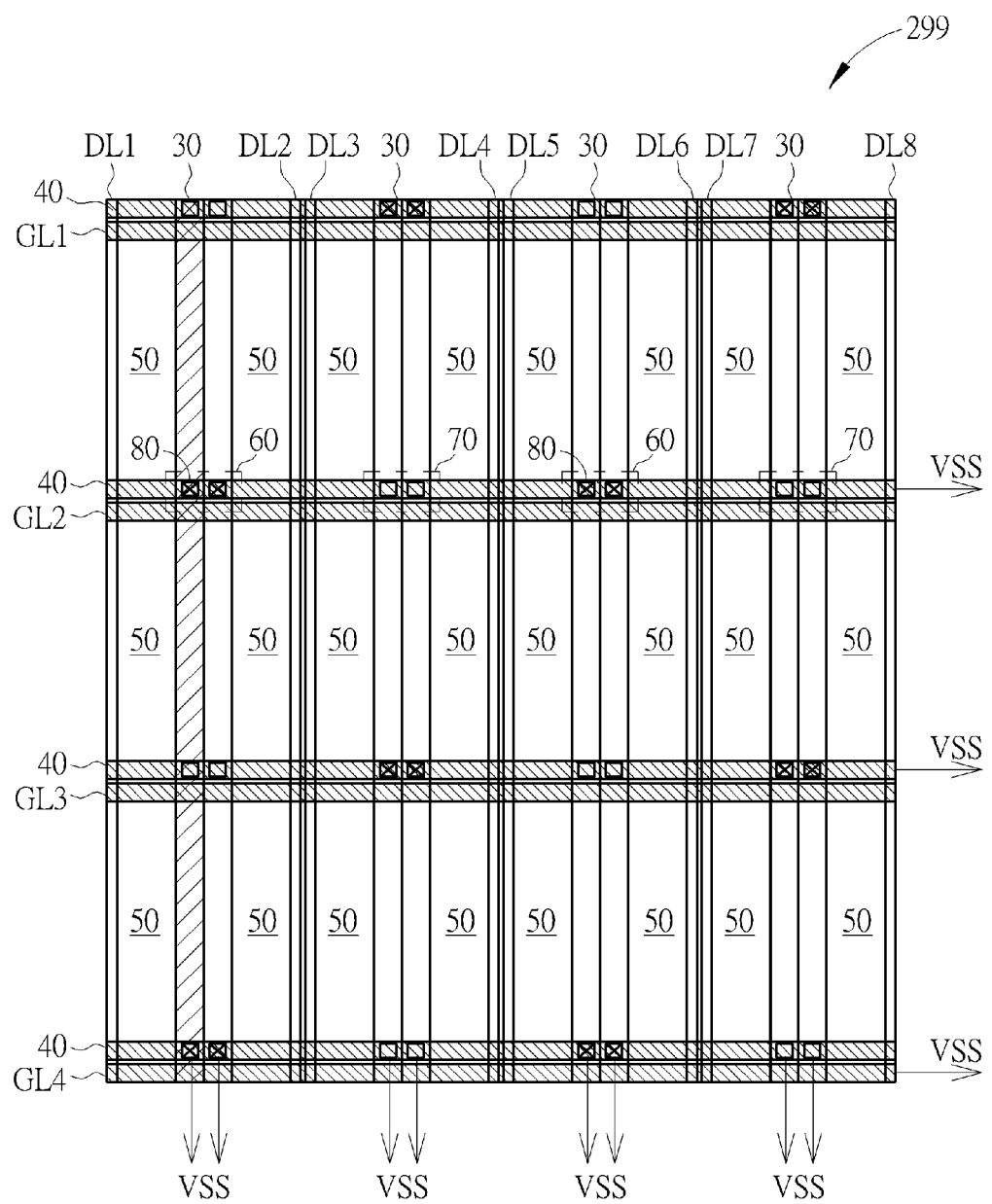
FIG. 3A shows a light emitting diode display panel according to a third embodiment of the present invention.

Please refer to FIG. 3A. FIG. 3A shows a light emitting diode display panel 299 according to a third embodiment of the present invention. As shown in FIG. 3A, the light emitting diode display panel 299 includes a plurality of pixel units 50, a plurality of third bar-shaped electrode layers 30 arranged along a first direction and a plurality of fourth bar-shaped electrode layers 40 arranged along a second direction. The first direction and the second direction can be a vertical direction and a horizontal direction respectively. The pixel units 50 can be arranged as an array and coupled to a plurality of data lines DL1~DL8 and a plurality of scan lines GL1~GL3 of the light emitting diode display panel 299. The third bar-shaped electrode layers 30 are coupled to a second power supply VSS and the pixel units 50. The fourth bar-shaped electrode layers 40 are electrically coupled to the second power supply VSS and the pixel units 50 through corresponding third bar-shaped electrode layers 30. The second power supply VSS can be a voltage source with a low reference voltage level.

Furthermore, only a non-complete portion of a plurality of overlap positions between the third bar-shaped electrode layers 30 and the fourth bar-shaped electrode layers 40 have conductive paths 80 electrically coupled to the corresponding third bar-shaped electrode layers 30 and the corresponding fourth bar-shaped electrode layers 40. For instance, an overlap position 60 has conductive paths 80 while an overlap position 70 does not have any conductive path 80. The conductive path 80 can be formed as a via configured to electrically couple the third bar-shaped electrode layer 30 to the corresponding fourth bar-shaped electrode layer 40. Each of the third bar-shaped electrode layers 30 is arranged across the fourth bar-shaped electrode layers 40 so as to form overlap positions 60, 70. The overlap positions 60 with conductive paths 80 and the overlap positions 70 without any conductive path 80 can be arranged alternatively along each of the third bar-shaped electrode layers 30 and each of the fourth bar-shaped electrode layers 40.

Because only the overlap positions 60, a non-complete portion of the overlap positions between the third bar-shaped electrode layers 30 and the fourth bar-shaped electrode layers 40, have conductive paths 80, each of the fourth bar-shaped electrode layers 40 is only electrically coupled to the corresponding third bar-shaped electrode layers 30 through the overlap positions 60. And currents can only flow between the fourth bar-shaped electrodes 40 and the third bar-shaped electrodes 30 having conductive paths 80 formed therebetween. Take the second one of the fourth bar-shaped electrode layers 40 from the top of FIG. 3A as an example, because the second one of the fourth bar-shaped electrode layer 40 is only electrically coupled to the first and the third ones of the third bar-shaped electrode layers 30 from the left of FIG. 3A through the four conductive paths 80, the second one of the fourth bar-shaped electrode layer 40 only receives currents through the four conductive paths 80 of the overlap positions 60 from the first and the third ones of the third bar-shaped electrode layers 30.

Comparing with a configuration where every overlap position has conductive paths 80 so as to electrically couple all of the third bar-shaped electrode layers 30 to all of the fourth bar-shaped electrode layers 40, the current flowing through the fourth bar-shaped electrode layers 40 in the light emitting diode display panel 299 can be reduced, and hence voltage drops generated by the mentioned currents multiplied by impedances of the fourth bar-shaped electrode layers 40 in FIG. 3A are also reduced because the impedance of each of the fourth bar-shaped electrode layers 40 remains unchanged. Therefore voltage levels applied to the pixel units 50 can be more close to the second power supply VSS supplied to the light emitting diode display panel 299.

Figure 3B:
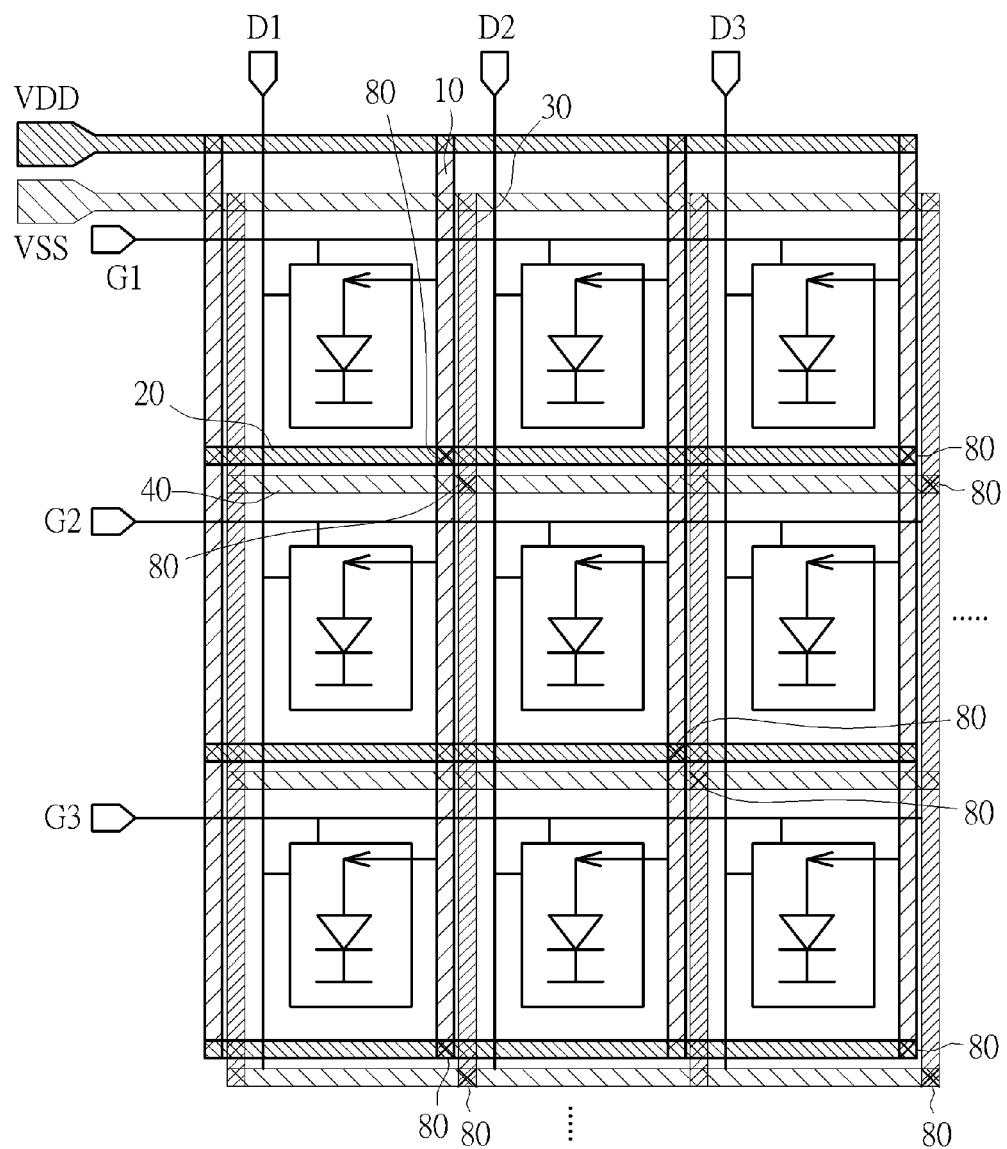
FIG. 3B shows a light emitting diode display panel according to a fourth embodiment of the present invention.

Please refer to FIG. 3B. FIG. 3B shows a light emitting diode display panel 300 according to a fourth embodiment of the present invention. According to FIG. 3B, the difference between the light emitting diode display panel 300 and the light emitting diode display panel 100 in FIG. 1A is that the light emitting diode display panel 300 further includes a plurality of third bar-shaped electrode layers 30 arranged in vertical direction and a plurality of fourth bar-shaped electrode layers 40 arranged in horizontal direction. The third bar-shaped electrode layers 30 are electrically coupled to a second power supply VSS and a plurality of pixel units 50. Moreover, the currents in the pixel units 50 are outputted to the third bar-shaped electrode layers 30, and the fourth bar-shaped electrode layers 40 are electrically coupled to the second power supply VSS. Only a non-complete portion of a plurality of overlap positions between the third bar-shaped electrode layers 30 and the fourth bar-shaped electrode layers 40 have conductive paths 80 configured to electrically couple the third bar-shaped electrode layers 30 to the corresponding fourth bar-shaped electrode layers 40.

According to the configuration in FIG. 3B, each of the second bar-shaped electrode layers 20 is configured to provide a current to a non-complete portion of the first bar-shaped electrode layers 10 arranged across the second bar-shaped electrode layers 20 so that only the corresponding first bar-shaped electrode layers 10 with conductive paths 80 formed to couple the second bar-shaped electrode layers 20 are supplied with currents. Each of the third bar-shaped electrode layers 30 is configured to receive currents from a non-complete portion of the fourth bar-shaped electrode layers 40 arranged across the third bar-shaped electrode layer 30. Besides, the overlap positions 60 with conductive paths 80 and the overlap positions 70 without any conductive path 80 between the third bar-shaped electrode layers 30 and the fourth bar-shaped electrode layers 40 can be formed in the configuration of FIG. 1B. It will not be further described hereinafter.

Figure 4:
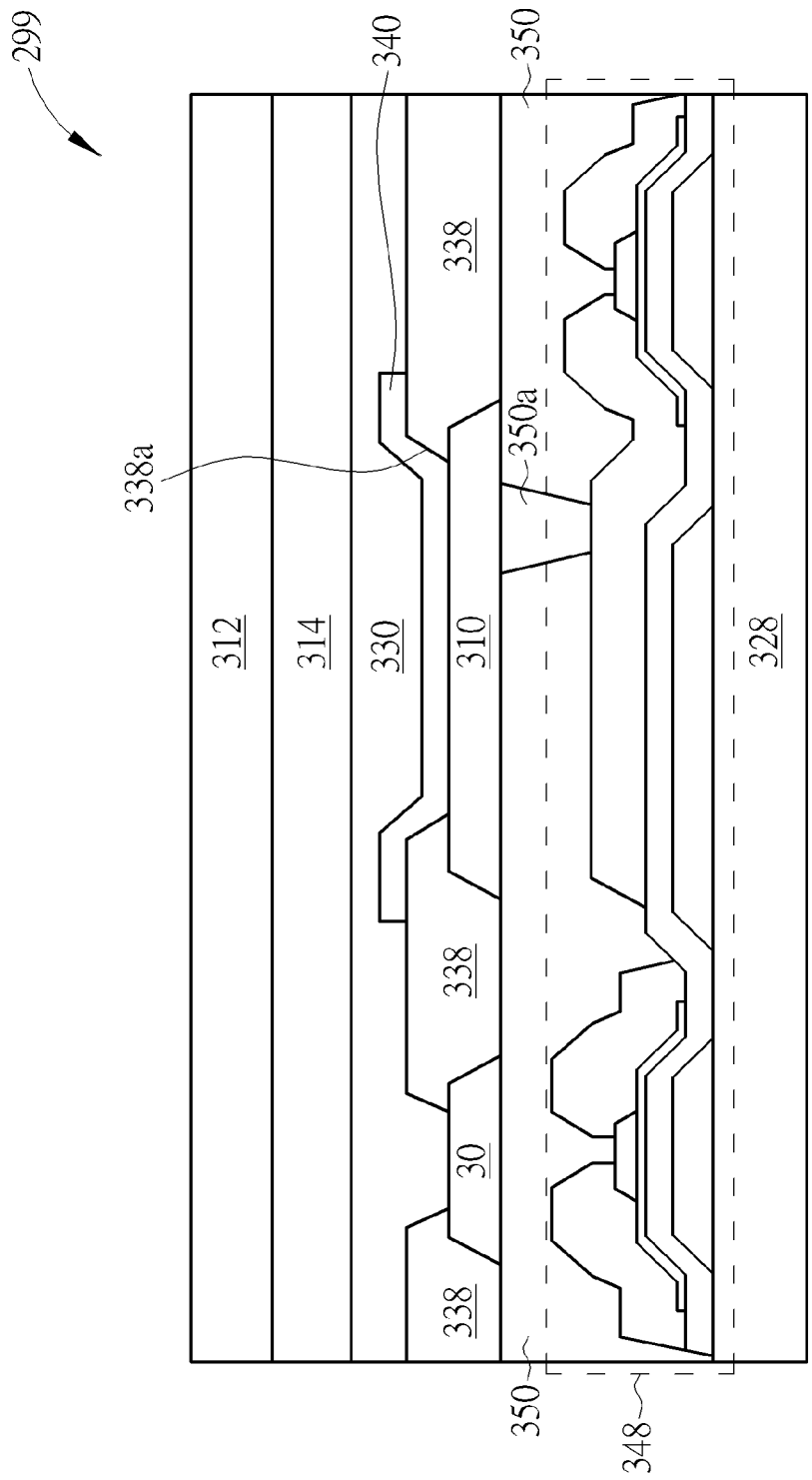
FIG. 4 shows a structure of the light emitting diode display panel in FIG. 3A.

Please refer to FIG. 4 and FIG. 3A. FIG. 4 shows a structure of the light emitting diode display panel 299 in FIG. 3A. In FIG. 4, the light emitting diode display panel 299 includes an upper substrate 312, a packaging layer 314, a conductive layer 330, a light emitting diode layer 340, a barrier rib 338, a first electrode 310, the third bar-shaped electrode layer 30, a first flat layer 350, an active component 348 and a lower substrate 328. The conductive layer 330 covers the third bar-shaped electrode layer 30 and the fourth bar-shaped electrode layer 40 (which is not shown in FIG. 4) and is electrically coupled to a pixel unit 50. For example, the conductive layer 330 may cover whole area of the light emitting diode display panel 299 and be configured to be a low level voltage source such as to a ground level. The active component 348 is electrically coupled to the light emitting diode layer 340 through a via 350a and the first electrode 310 and configured to provide a necessary current for the light emitting diode layer 340 to emit light. The provided current flows into the first electrode 310 through the via 350a and then flows from the first electrode 310 to the conductive layer 330 through the light emitting diode layer 340.

Each of the pixel units 50 includes a light emitting layer 340 electrically coupled to the third bar-shaped electrode layers 30 through the conductive layer 330. In the light emitting diode display panel 299, the conductivity of the conductive material selected to form the third bar-shaped electrode layers 30 and the fourth bar-shaped electrode layers 40 is greater than the conductivity of the material of the conductive layer 330. In the light emitting diode display panel 299, the third bar-shaped electrode layer 30 and the fourth bar-shaped electrode layer 40 can be two kinds of auxiliary electrodes formed along two different directions. Because the conductivity of the auxiliary electrodes is greater than conductivity of the conductive layer 330, a specific portion of currents flowing out of the pixel units 50 flows through the third bar-shaped electrode layers 30 and the fourth bar-shaped electrode layers 40 toward the second power supply VSS.

An opening 338a is formed between the barrier rib 338 and the light emitting diode layer 340. According to FIG. 3A, only a non-complete portion of all overlap positions between two kinds of auxiliary electrodes have conductive paths so as to electrically couple the two kinds of auxiliary electrodes. The active component 348 includes an N-type or a P-type thin film transistor like the N-type thin film transistors T1 and T3 in FIG. 2B. The upper substrate 312 and the lower substrate 328 can be made of glass, reinforced glass, plastic, sapphire ($Al_2O_3$) or quartz ($SiO_2$) and can be formed as a rigid substrate, a non-rigid substrate, or a flexible substrate. Besides, the packaging layer 314 includes glue.

Figure 5A:
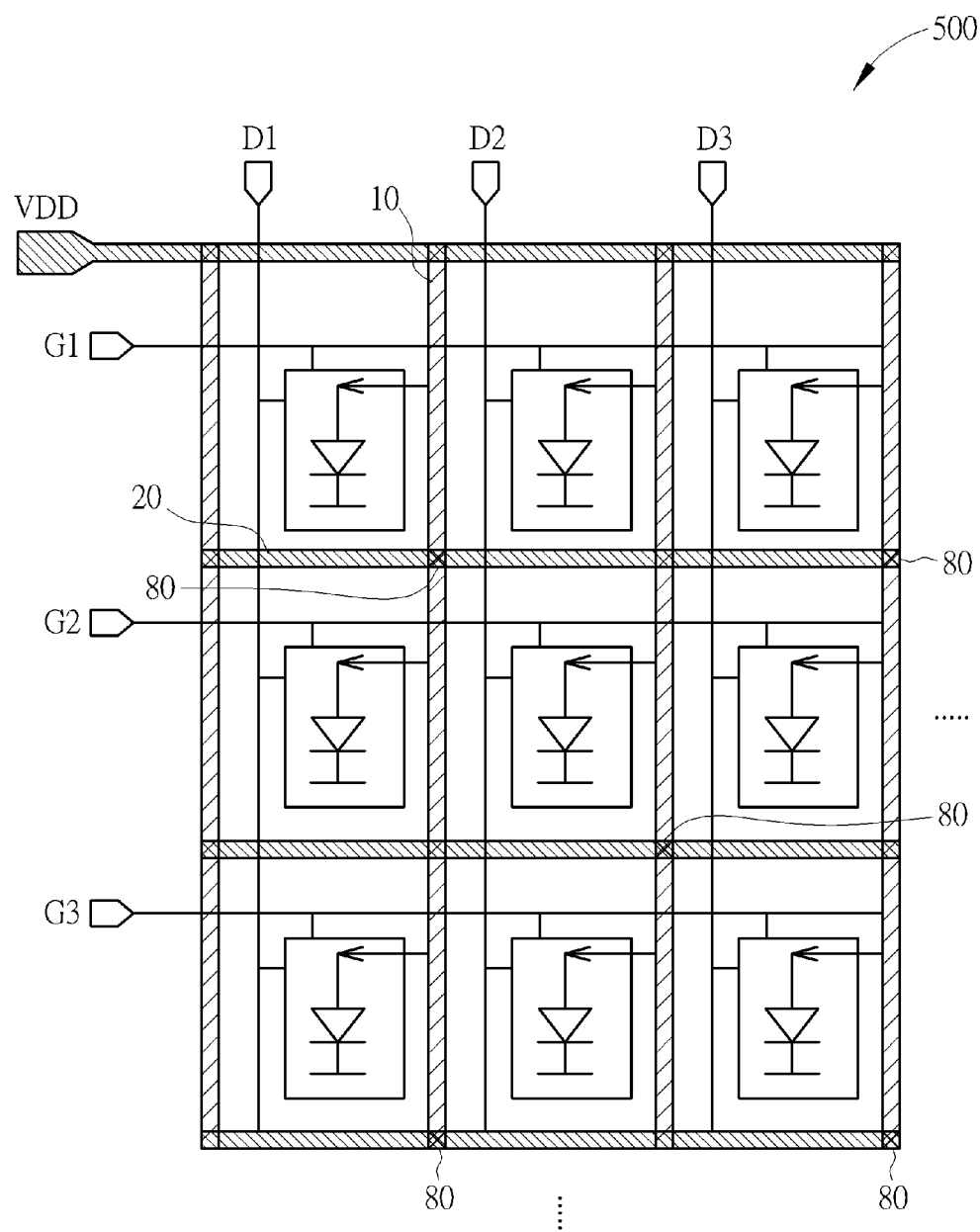
FIG. 5A shows a circuit at a side of a thin film transistor array of a light emitting diode display panel according to a fifth embodiment of the present invention.
Figure 5B:
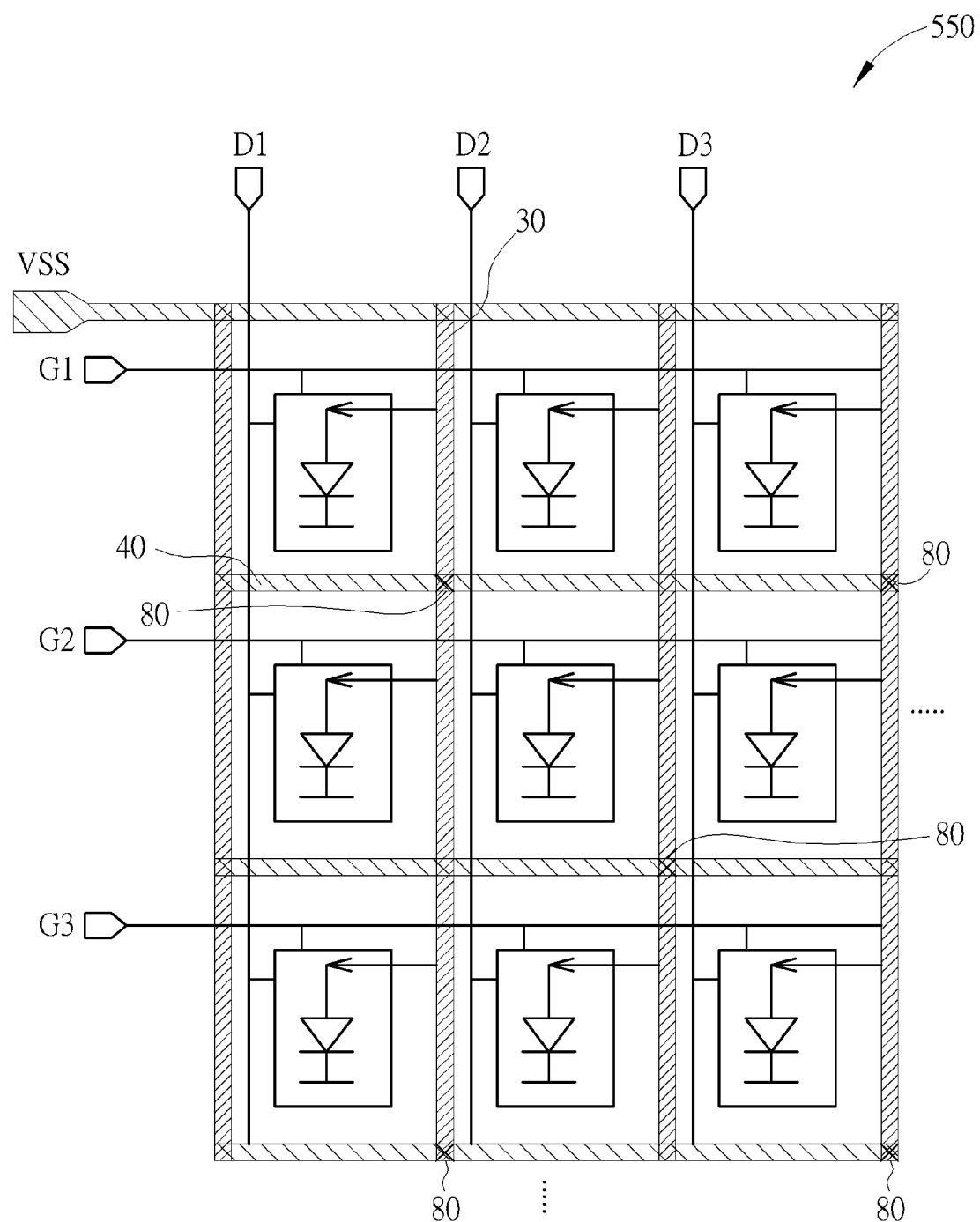
FIG. 5B shows a circuit at a side of a color filter of a light emitting diode display panel according to a sixth embodiment of the present invention.
Figure 6:
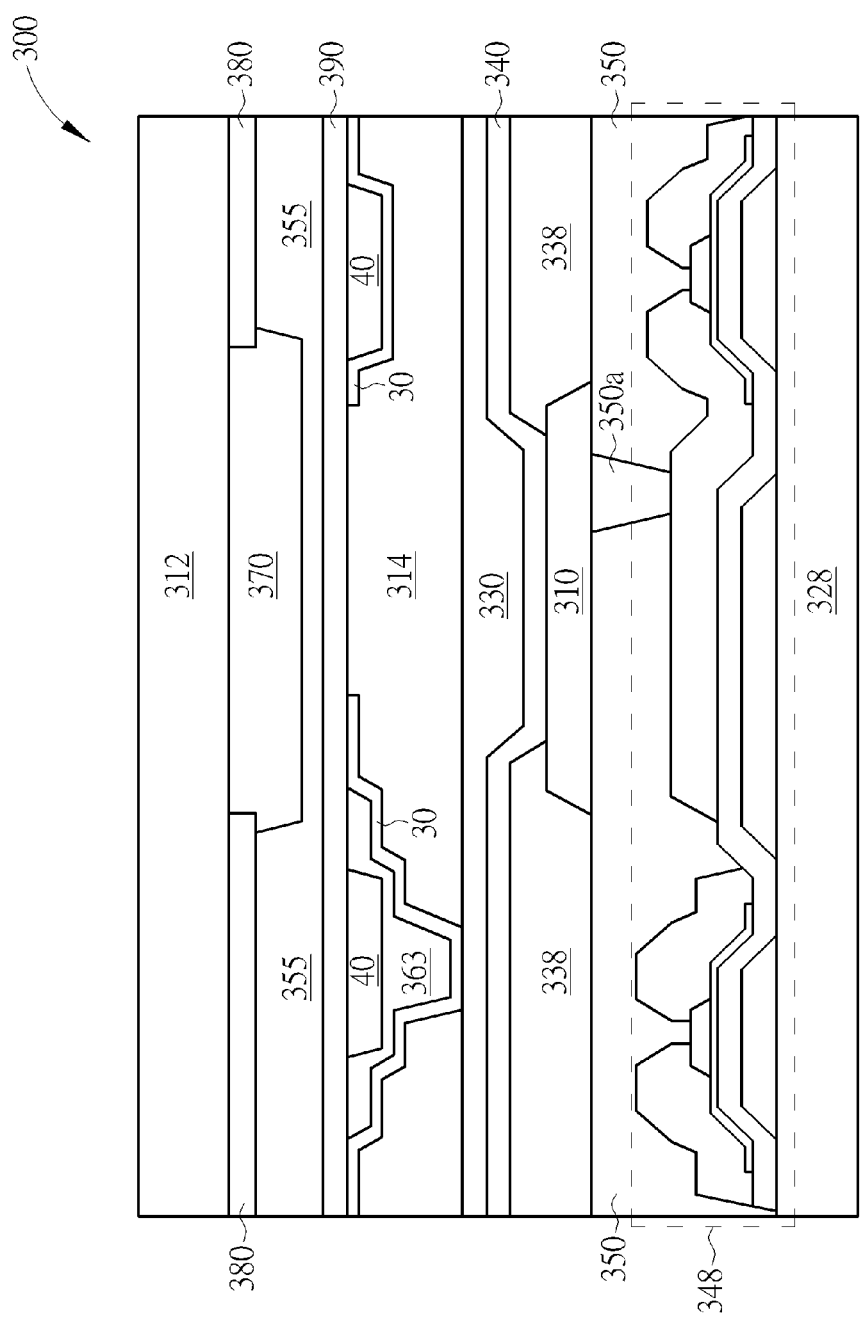
FIG. 6 shows a structure of the light emitting diode display panel in FIG. 5B.

Please refer to FIG. 5A, FIG. 5B and FIG. 6. FIG. 5A shows a circuit 500 at a side of a thin film transistor array of a light emitting diode display panel according to a fifth embodiment of the present invention. FIG. 5B shows a circuit 550 at a side of a color filter (CF) of a light emitting diode display panel according to a sixth embodiment of the present invention. It is noted that not every overlap position between a third bar-shaped electrode layer 30 and a corresponding fourth bar-shaped electrode layer 40 has a spacer 363, and the spacer 363 can be used to electrically insulate the third bar-shaped electrode layer 30 from the fourth bar-shaped electrode layer 40. Besides, a first bar-shaped electrode layer 10 can be used for electrical connection in this embodiment.

FIG. 6 shows a structure of the light emitting diode display panel 300 in FIG. 5B. According to FIG. 6, the light emitting display panel 300 includes an upper substrate 312, a black matrix 380, a color filter layer 370, a second flat layer 335, a passivation layer 390, a third bar-shaped electrode layer 30, a fourth bar-shaped electrode layer 40, a spacer 363, a packaging layer 314, a conductive layer 330, a light emitting diode (LED) layer 340, a barrier rib 338, a first electrode 310, a first flat layer 350, an active component 348 and a lower substrate 328. According to the structure shown in FIG. 6, each of the pixel units 50 further comprises the first electrode 310 and the color filter layer 370. The first electrode 310 and the conductive layer 330 are formed at opposite sides of the LED layer 340 and are configured to drive the LED layer 340 to emit light. The color filter layer 370 and the third and fourth bar-shaped electrode layers 30, 40 are formed at the same side of the LED layer 340.

The active component 348 is electrically coupled to the LED layer 340 through a via 350a and the first electrode 310 and is configured to provide a current to the LED layer 340 for emitting light. The provided current flows to the conductive layer 330 through the via 350a and the first electrode 310.

In FIG. 6, the spacers 363 are only formed at a non-complete portion of the overlap positions between the third bar-shaped electrode layers 30 and the fourth bar-shaped electrode layers 40, and no spacer 363 is formed at the remaining overlap positions. The spacers 363 are formed to electrically insulate the third bar-shaped electrode layers 30 from the corresponding fourth bar-shaped electrode layers 40, and hence the third bar-shaped electrode layers 30 can be electrically coupled to the corresponding fourth bar-shaped electrode layers 40 at overlap positions without the spacers 363. In the light emitting diode display panel 300, the third bar-shaped electrode layers 30 and the fourth bar-shaped electrode layers 40 can be two kinds of auxiliary electrodes arranged along two different directions. Because conductivity of the auxiliary electrodes is selected to be greater than conductivity of the conductive layer 330, a specific portion of currents flowing out of the pixel units 50 flows to the second power supply VSS through the third bar-shaped electrode layers 30 and fourth bar-shaped electrode layers 40.

The black matrices 380 cover each of the fourth bar-shaped electrode layers 40 respectively. The black matrix 380 is generated by performing a lithographic process for shielding an opaque component such as the active component 348. According to the configurations in FIGS. 2B, 5B and 6, the first power supply VDD is coupled to a layer below the conductive layer 330 while the second power supply VSS is coupled to a layer above the conductive layer 330. In more detail, as shown in FIG. 2B, the first power supply VDD is coupled to the drain terminal of the N-type TFT T3, and the N-type TFT T3 is formed as the active component 348 shown in FIG. 6. As shown in FIG. 5B, the second power supply VSS is coupled to the third bar-shaped electrode layers 30 and the fourth bar-shaped electrode layers 40, and the third and fourth bar-shaped electrode layers 30 and 40 are formed above the packaging layer 314 as shown in FIG. 6. Comparing with FIG. 4, the LED layer 340 in FIG. 6 can be formed throughout the light emitting diode display panel 300.

In FIG. 6, the third bar-shaped electrode layers 30 are electrically insulated from the fourth bar-shaped electrode layers 40 through the spacers 363 at a non-complete portion of overlap positions between the third bar-shaped electrode layers 30 and the fourth bar-shaped electrode layers 40, so as to configure the mesh layout as shown in FIG. 5B. Besides, the circuit 500 in FIG. 5A can be configured as the configuration in FIG. 1A to form a double mesh layout. In the embodiments of the present invention, double mesh layout can be formed to reduce the current in each of the traces.

Figure 7:
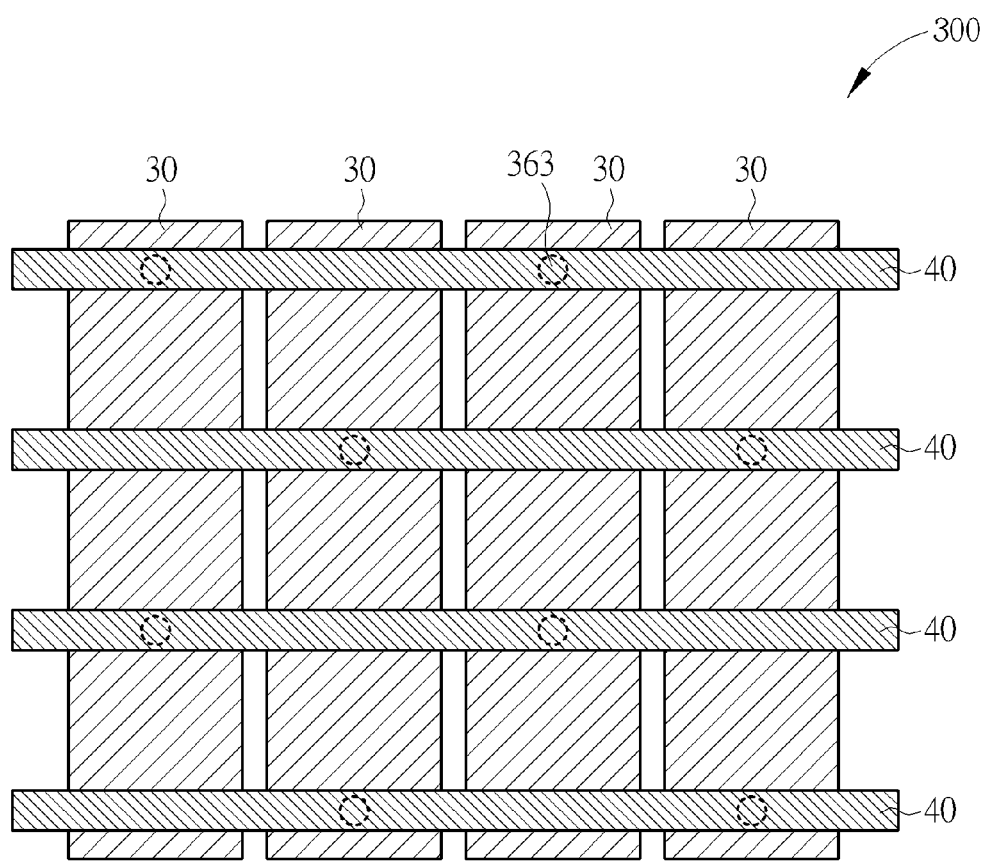
FIG. 7 shows a layout of the light emitting diode display panel in FIG. 6.

Please refer to FIG. 7. FIG. 7 shows a layout of the light emitting diode display panel 300 in FIG. 6. In FIG. 7, each of the fourth bar-shaped electrode layers 40 is formed at a side of the third bar-shaped electrode layers 30, and the spacers 363 are formed at a non-complete portion of overlap positions between the third bar-shaped electrode layers 30 and the fourth bar-shaped electrode layers 40. The third bar-shaped electrode layers 30 can be formed of Indium Tin Oxide (ITO) or other materials. The fourth bar-shaped electrode layers 40 can be formed of aluminum or other opaque materials.

In conclusion, the mentioned embodiments of the present invention provide examples to teach configurations of the light emitting diode display panel and related production process. Among a plurality of overlap positions between two bar-shaped electrode layers arranged along two different directions, only a non-complete portion of all overlap positions have conductive paths to electrically couple the two bar-shaped electrode layers so that a current flowing through each of the traces can be reduced, and a voltage drop on a trace can thus be reduced. Therefore a current decay in a light emitting diode display panel caused by a voltage drop due to the impedance of traces can be reduced, minimizing the problem of uneven brightness and brightness decay of an LED display panel.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A light emitting diode display panel comprising:
   a plurality of pixel units;
   a plurality of first bar-shaped electrode layers arranged along a first direction and electrically coupled to a first power supply and the pixel units;
   a plurality of second bar-shaped electrode layers arranged along a second direction and electrically coupled to the first power supply;
   a plurality of third bar-shaped electrode layers arranged along the first direction and electrically coupled to a second power supply and the pixel units;
   a plurality of fourth bar-shaped electrode layers arranged along the second direction and electrically coupled to the second power supply;
   a light emitting diode layer electrically coupled to the plurality of third bar-shaped electrode layers; and
   a conductive layer covering the light emitting diode layer;
   wherein only a non-complete portion of a plurality of overlap positions between the third bar-shaped electrode layers and the fourth bar-shaped electrode layers have second conductive paths electrically coupled to corresponding third bar-shaped electrode layers and fourth bar-shaped electrode layers;
   wherein the light emitting diode layer is electrically coupled to the plurality of third bar-shaped electrode layers through the conductive layer, each of the pixel units comprises a first electrode and a color filter layer, the first electrode is formed at a side of the light emitting diode layer to the conductive layer and configured to drive the light emitting diode layer to emit light with the conductive layer, and the color filter layer is formed at a side of the plurality of third bar-shaped electrode layers and the plurality of fourth bar-shaped electrode layers corresponding to the light emitting diode layer;
   wherein only a portion of a plurality of overlap positions between the first bar-shaped electrode layers and the second bar-shaped electrode layers have first conductive paths electrically coupled to corresponding first bar-shaped electrode layers and second bar-shaped electrode layers.

2. The light emitting diode display panel of claim 1, wherein the first conductive paths are vias.

3. The light emitting diode display panel of claim 2, wherein the first power supply is a high reference voltage level power supply, and each of the pixel units has a light emitting diode and a P-type transistor configured to adjust a current flowing through the light emitting diode according to a voltage difference between a gate terminal and a source terminal of the P-type transistor.

4. The light emitting diode display panel of claim 2, wherein the first power supply is a low reference voltage level power supply, and each of the pixel units has a light emitting diode and an N-type transistor configured to adjust a current flowing through the light emitting diode according to a voltage difference between a gate terminal and a source terminal of the N-type transistor.

5. The light emitting diode display of claim 1, wherein each second bar-shaped electrode layer is disposed to provide and/or receive a current from a portion of the plurality of first bar-shaped electrode layers intersecting the second bar-shaped electrode layer.

6. The light emitting diode display panel of claim 5, wherein the first power supply is a high reference voltage level power supply, and each of the pixel units has a light emitting diode and a P-type transistor configured to adjust a current flowing through the light emitting diode according to a voltage difference between a gate terminal and a source terminal of the P-type transistor.

7. The light emitting diode display panel of claim 5, wherein the first power supply is a low reference voltage level power supply, and each of the pixel units has a light emitting diode and an N-type transistor configured to adjust a current flowing through the light emitting diode according to a voltage difference between a gate terminal and a source terminal of the N-type transistor.

8. The light emitting diode display panel of claim 1, wherein the first power supply is a high reference voltage level power supply, and each of the pixel units has a light emitting diode and a P-type transistor configured to adjust a current flowing through the light emitting diode according to a voltage difference between a gate terminal and a source terminal of the P-type transistor.

9. The light emitting diode display panel of claim 1, wherein the first power supply is a low reference voltage level power supply, and each of the pixel units has a light emitting diode and an N-type transistor configured to adjust a current flowing through the light emitting diode according to a voltage difference between a gate terminal and a source terminal of the N-type transistor.

10. A light emitting diode display panel comprising:
    a plurality of pixel units;
    a plurality of first bar-shaped electrode layers arranged along a first direction and electrically coupled to a first power supply and the pixel units;
    a plurality of second bar-shaped electrode layers arranged along a second direction and electrically coupled to the first power supply; and
    a conductive layer electrically coupled to the pixel units and covering the plurality of first bar-shaped electrode layers and the plurality of second bar-shaped electrode layers;
    wherein each of the pixel units comprises a light emitting diode layer electrically coupled to a corresponding first bar-shaped electrode layer through the conductive layer;
    wherein only a portion of a plurality of overlap positions between the first bar-shaped electrode layers and the second bar-shaped electrode layers have first conductive paths electrically coupled to corresponding first bar-shaped electrode layers and second bar-shaped electrode layers.

11. The light emitting diode display panel of claim 10 wherein conductivity of the plurality of first bar-shaped electrode layers and the plurality of second bar-shaped electrode layers is greater than conductivity of the conductive layer.

12. A light emitting diode display panel comprising:
    a plurality of pixel units;
    a plurality of first bar-shaped electrode layers arranged along a first direction and electrically coupled to a first power supply and the pixel units;

a plurality of second bar-shaped electrode layers arranged along a second direction and electrically coupled to the first power supply;
a light emitting diode layer electrically coupled to the plurality of first bar-shaped electrode layers; and
a conductive layer covering the light emitting diode layer wherein the light emitting diode layer is electrically coupled to the plurality of first bar-shaped electrode layers through the conductive layer, each of the pixel units comprises a first electrode and a color filter layer, the first electrode is formed at a side of the light emitting diode layer corresponding to the conductive layer and configured to drive the light emitting diode layer to emit light with the conductive layer, and the color filter layer is formed at a side of the plurality of first bar-shaped electrode layers and the plurality of second bar-shaped electrode layers corresponding to the light emitting diode layer;

wherein only a portion of a plurality of overlap positions between the first bar-shaped electrode layers and the second bar-shaped electrode layers have first conductive paths electrically coupled to corresponding first bar-shaped electrode layers and second bar-shaped electrode layers.

13. The light emitting diode display panel of claim 12 wherein a spacer is formed at an overlap position between a first bar-shaped electrode layer and a second bar-shaped electrode layer where no conductive path is formed.

14. The light emitting diode display panel of claim 13 further comprising a plurality of black matrices covering the plurality of second bar-shaped electrode layers.

15. The light emitting diode display panel of claim 12 further comprising a plurality of black matrices covering the plurality of second bar-shaped electrode layers.

* * * * *